United States Patent [19]

Kobayashi et al.

[11] Patent Number: 5,363,796
[45] Date of Patent: Nov. 15, 1994

[54] APPARATUS AND METHOD OF GROWING SINGLE CRYSTAL

[75] Inventors: Sumio Kobayashi, Yamatokohriyama; Shunji Miyahara, Itami; Toshiyuki Fujiwara, Nishinomiya; Takayuki Kubo; Hideki Fujiwara, both of Amagasaki; Shuichi Inami, Nishinomiya, all of Japan

[73] Assignee: Sumitomo Metal Industries, Ltd., Osaka, Japan

[21] Appl. No.: 837,202

[22] Filed: Feb. 18, 1992

[30] Foreign Application Priority Data

| | | | |
|---|---|---|---|
| Feb. 20, 1991 | [JP] | Japan | 3-026163 |
| Feb. 20, 1991 | [JP] | Japan | 3-026261 |
| Feb. 20, 1991 | [JP] | Japan | 3-026387 |
| Nov. 22, 1991 | [JP] | Japan | 3-0355510 |

[51] Int. Cl.$^5$ .................................................. C30B 15/10
[52] U.S. Cl. .................................................. 117/30; 117/31; 117/217
[58] Field of Search .............. 156/617.1, 618.1, 619.1, 156/620; 427/249

[56] References Cited

U.S. PATENT DOCUMENTS

| | | | |
|---|---|---|---|
| 2,904,512 | 9/1959 | Horn | 150/619.1 |
| 2,962,363 | 11/1960 | Martin | 156/617.1 |
| 2,998,335 | 8/1961 | Pehmelt | 156/617.1 |
| 3,058,854 | 10/1962 | Angello | 156/619.1 |
| 3,627,500 | 12/1971 | Ciszek | 156/618.1 |
| 3,798,007 | 3/1974 | Bachman et al. | 156/619.1 |
| 4,086,424 | 4/1978 | Mellen | 156/619.1 |
| 4,330,361 | 5/1982 | Kuhn-Kuhnenfeld et al. | 156/620.4 |
| 4,378,269 | 3/1983 | Matsushita et al. | |
| 4,874,458 | 10/1989 | Nishizawa | |

FOREIGN PATENT DOCUMENTS

| | | | |
|---|---|---|---|
| 0177132 | 4/1986 | European Pat. Off. | |
| 34-8242 | 9/1959 | Japan | |
| 61-205691 | 9/1986 | Japan | |
| 61-215285 | 9/1986 | Japan | 156/619.1 |
| 62-880 | 1/1987 | Japan | |
| 62-15391 | 7/1987 | Japan | |
| 63-252989 | 10/1988 | Japan | |
| 3-12389 | 1/1991 | Japan | 156/619.1 |
| 2139918A | 11/1984 | United Kingdom | |

*Primary Examiner*—Robert Kunemund
*Attorney, Agent, or Firm*—Burns, Doane, Swecker & Mathis

[57] ABSTRACT

An apparatus for growing a single crystal having a crucible, two heaters arranged at the outside of the crucible and along the vertical direction, a heat shield placed at the outside of the heaters, a radiation shield for shielding the single crystal from the radiation heat, and an upper heat shield for preventing the upward heat, transfer of the heaters. In the apparatus, a melted layer and solid layer of raw material are formed in the upper and lower portions of the crucible, respectively. While melting the solid layer, the single crystal is pulled up. The lower portion of the heat shield is thinner than the upper portion. The ratio of the height to the diameter of the crucible is 0.85 or more. The melting amount of the solid layer is controlled in the pulling process according to the non-segregation condition in the variable-thickness melted layer method. The oxygen concentration of the pulled single crystal is controlled in the pulling process by adjusting the rotation speed and rotation direction of the crucible.

24 Claims, 10 Drawing Sheets

APPARATUS AND METHOD OF GROWING SINGLE CRYSTAL

BACKGROUND OF THE INVENTION

1. Field of the Invention

This invention relates to an apparatus and method of growing single crystal for growing a silicon single crystal, which is used as a semiconductor material.

2. Description of Related Art

Generally, the Czochralski (CZ) method is widely employed for growing a single crystal.

FIG. 1 is a schematic cross-sectional view illustrating an apparatus and method of growing a single crystal on the basis of the CZ method. FIG. 1 indicates crucible, crystal, heater and heat shields. The crucible 1 consists of a graphite crucible 1a and a quartz crucible, which are concentrically positioned, and is fixed to the upper end of a rotatable and liftable pedestal 1c. A heater 2 is arranged at the outside of the crucible 1, and heat shields 3 and 4 are positioned at the outside of and below the heater 2, respectively.

In such an apparatus, a raw material for a crystal is charged into the crucible 1, and melted by tile heater 2 arranged at the outside of the crucible 1. Then, a seed 7 suspended from a wire 6 is immersed into the melted material L. While rotating, the seed 7 is pulled up, so that a single crystal 8 grows at the lower end of the seed 7.

When a single crystal is to be used as a semiconductor substrate, an impurity is usually added into the molten material L in the crucible 1, thereby adjusting the resistivity and conductivity type of the single crystal. Since such an impurity usually segregates toward the pulling direction of the single crystal 8, however, it is very difficult to obtain a crystal, in which an impurity concentration is uniform in the entire length of the single crystal 8 along the crystal growth direction.

This non-uniformity of an impurity comes from the segregation of the impurity in solidification. The ratio $C_S/C_L$, where $C_S$ and $C_L$ are the impurity concentration of the single crystal at the interface of the single crystal and the molten material L and the average impurity concentration of the molten material L, respectively, (i.e., the effective segregation coefficient Ke) is not 1.

It has been known to employ the melted layer method in order to suppress the segregation. FIG. 2 is a schematic cross-sectional view illustrating an apparatus for growing a single crystal according to the melted layer method. In this apparatus, the heater 2 is controlled so that a solid layer S formed at the bottom of the crucible 1 coexists with the melted lawyer L of the raw material formed above the solid layer, and under this coexisting state the single crystal 8 is grown by the same process as described in FIG. 1.

This melted layer method can be classified into the constant-thickness melted layer method and the variable-thickness melted layer method. The former is disclosed in Japanese Patent Application Publication (Kokoku) Nos. 34-8,242, 62-880, Japanese Patent Application Laid-Open (Kokai) No. 63-252,989, and the latter in Japanese Patent Application Laid-Open (Kokai) No. 61-205,691, In the constant-thickness melted layer method, the heater 2 is controlled during the pulling process so that the reduction of molten liquid caused by the pulling of the single crystal can be replenished by melting the solid layer S in order to keep the thickness of the melted layer L constant arid maintain the impurity concentration in the axial direction of single crystal more uniformly than the CZ method. And it possible that an impurity is continuously added during the growing in order to improve the uniformity. By contrast, in the variable-thickness melted layer method, the volume of the melted layer L is intentionally varied so that the impurity concentration in the axial direction of single crystal can be maintained at a constant value. The variable-thickness melted layer method is superior to the constant-thickness melted layer method from the viewpoint of realizing the non-segregation condition without the adding of impurity during the growing.

The principle of reducing the segregation in the above-described melted layer method can be described using a one-dimensional model shown in FIG. 3 in which the weight of the raw material initially charged in the crucible 1 (the initial charge amount) is "1" and the impurity concentration at a position of a weight ratio x measured from the upper surface of the raw material is expressed as $C_p(x)$.

When the weight ratio of the pulled crystal for the initial charge amount of 1 is $f_S$, the weight ratio of the molten liquid is $f_L$, the weight ratio of the solid at the lower portion in the crucible is $f_P$, and $f_O = f_S + f_L$, following equation (1) holds:

$$f_O + f_P = f_S + f_L + f_P = 1 \qquad (1)$$

The case that the impurity concentration $C_P$ of raw material is not zero (i.e., $C_P \neq 0$) will be described. In FIG. 3, the left side of the figure corresponds to the upper side of the crystal and the right side to the bottom of the solid layer.

FIG. 3(a) illustrates the concentration distribution obtained immediately after a raw material is charged into the crucible 1. In this state, the solid ratio $f_P$ is 1. FIG. 3(b) illustrates the concentration distribution obtained at the end of the initial melting process in which the upper portion of the raw material extending by the distance $f_L$ from the upper surface of the raw material is melted, and an impurity is added. In the figure, $C_O$ indicates the impurity concentration of the initial melted layer, and $f_O = f_L$.

FIG. 3 (c) illustrates the variation of the concentration obtained during the growth process. When the single crystal is pulled up by $f_S$ from the melted layer, the raw material positioned in the lower solid layer is melted (the melted portion is indicated by $f_L$). In the figure, $C_L$ and $C_P$ indicate the impurity concentration of the melted layer and that of the lower solid layer, respectively.

When the impurity of an amount of $C_a \cdot \Delta f_S$ is added while the single crystal is further pulled up by $\Delta f_S$ from $f_S$ as shown in FIG. 3(d), $f_L$, $C_L$ and $f_P$ change to $f_L + \Delta f_L$, $C_L + \Delta C_L$, and $f_P + \Delta f_P$, respectively. In the figure, $C_S$ indicates the impurity concentration of the single crystal. In this case, the impurity amount of the region indicated by $C_L$ and $C_P$ before change, and $C_S$ and $C_L + \Delta C_L$ after change (i.e., the region indicated by A in the figure) is constant. Therefore, following equation (2) holds:

$$C_L \cdot f_L + C_a \cdot \Delta f_S + C_P \cdot \Delta f_0 = \qquad (2)$$
$$C_S \cdot \Delta f_S + (C_L + \Delta C_L) \cdot (f_L + \Delta f_L)$$

where $C_S$ is defined by equation (3) below using the effective segregation coefficient Ke:

$$C_S = K_e \cdot C_L \tag{3}$$

By substituting equation (3) into equation (2) and omitting the second order small term, following equation (4) is obtained:

$$f_L \cdot \frac{dC_L}{df_S} + \left(K_e + \frac{df_L}{df_S}\right) \cdot C_L = C_a + C_P \cdot \frac{df_0}{df_S} \tag{4}$$

In the usual CZ method, $f_P, \Delta f_L + \Delta f_S$ and $C_a$ are zero ($f_P=0$, $\Delta f_L + f_S = 0$ and $C_a = 0$), and therefore following equation (5) holds:

$$(1 - f_S) \cdot \frac{dC_L}{df_S} + (K_e - 1) \cdot C_L = 0 \tag{5}$$

When equation (5) is substituted into equation (3), the following equation is obtained:

$$C_S = K_e \cdot C_O (1 - f_S)^{K_e - 1} \tag{6}$$

In the melted layer method, $dC_L/df_S$ and $C_P$ are zero ($dC_L/df_S = 0$ and $C_P = 0$), and hence equation (7) is obtained from equation (4) in a similar manner:

$$C_a = \left(K_e + \frac{df_L}{df_S}\right) \cdot C_L \tag{7}$$

This is the condition of realizing the non-segregation pulling. When this condition is applied to the constant-thickness melted layer method, $df_L/df_S$ is zero ($df_L/df_S = 0$), and consequently following equation (8) is obtained:

$$C_a = K_e \cdot C_L = K_e \cdot C_O \tag{8}$$

Then, the non-segregation condition can be realized by continuously adding the impurity.

In a case that the non-segregation condition is applied to the variable-thickness melted layer method, since the continuous addition of the impurity is not conducted in general $C_a$ is zero ($C_a = 0$), and hence following equation (9) is obtained from equation (7):

$$\frac{df_L}{df_S} = -K_e \tag{9}$$

The thickness of the melted layer is changed during the process of pulling the single crystal so as to satisfy equation (9), thereby realizing the non-segregation condition.

FIG. 3(e) illustrates the concentration distribution obtained when the lower solid is melted completely. In the constant-thickness melted layer method, after the solid layer S below the melted layer L is completely melted and $f_O$ becomes 1 ($f_O = 1$), the non-segregation condition is not satisfied, and the segregation starts in accordance with equation (6). By contrast, in the variable-thickness melted layer method, if following equation (10) is obtained from equation (9) holds until the end of the pulling, no segregation is attained to whole crystal.

$$f_L = f_{LO} - K_e \cdot f_S \tag{10}$$

where $f_{LO}$ is the initial ratio of the melted layer with no crystal.

In the above-described melted layer method, the neck process, which is necessary to attain the non-dislocation, is carried out, and then the shoulder portion is formed by increasing the diameter of the single crystal to a predetermined value (about 154 mm for a 6-inch single crystal). While maintaining the predetermined diameter, thereafter, the single crystal is pulled up at a constant rate (about 1 mm/min. for a 6-inch single crystal), thereby forming a cylindrical single crystal.

In the pulling process of the above-described melted layer method, however, it is difficult to accurately control the melting amount of the solid layer S by the single heater 2, and also to stably obtain the desired solid layer S, because the sufficient temperature gradient cannot be achieved along the vertical direction in the crucible 1. As a result, there arise problems in that the impurity concentration of the molten material in the pulling process is difficult to be maintained at a constant value, and that the resistivity is not constant in the axial direction of the single crystal.

Furthermore, for example, in a stage wherein only a part of a raw material is melted and most of the raw material remains unmelted, the molten material often penetrates into the lower solid material in the crucible 1, which is relatively cool, and solidifies therein. This causes the volume of the solid material to expand so that the solid material pushes the wall of the crucible 1, with the result that the crucible 1 is broken and the molten material leaks therefrom. This brings another problem in that the apparatus is caused to break down.

As described above, in the melted layer method, the solid layer S exists at the lower portion of the crucible. Since experience shows that, when the percentage of the solid layer S is high (i.e., when the percentage of the melted layer L is low), the yield is high, a crucible must be taller than that used in the CZ method. In the CZ method, the ratio of the height to the diameter of a crucible is usually in the range from about 0.6 to about 0.8. However, in the melted layer method (ML method), the ratio needs to be 0.85 or more.

One of the important items of evaluating the single crystal 8 is the oxygen concentration of the single crystal 8. It is important to control the oxygen concentration, in the viewpoints of improving the mechanical strength of the single crystal 8 and removing contaminants such as heavy metals from the device active region of a single crystal wafer (Gettering). Generally, oxygen is incorporated from the quartz crucible 1b to the melted layer L as following formula (11):

$$2SiO_2 \rightarrow 2SiO + O_2 \tag{11}$$

Since, in the melted layer method, the solid layer S exists at the lower portion of the crucible 1 as described above, however, the contact area between the crucible 1 and the melted layer L is small as compared with the CZ method. This causes a problem in that the oxygen concentration of the pulled single crystal 8 is low.

SUMMARY OF THE INVENTION

It is an object of the invention to provide an apparatus and method of growing a single crystal which can make the impurity concentration in the axial direction of a single crystal uniform and improve the yield.

It is another object of the invention to provide an apparatus and method of growing a single crystal which can prevent the crucible from being damaged.

It is a further object of the invention to provide an apparatus and method of growing a single crystal which can accurately control the melted amount of the solid layer so that the impurity concentration of the melted layer in the process of pulling the single crystal is kept constant.

It is a still further object of the invention to provide an apparatus and method of growing a single crystal having as high an oxygen concentration as obtained in the CZ method.

The apparatus for growing a single crystal of the invention in which the single crystal is grown by the melted layer method has a crucible, multiple heaters which are arranged along the vertical direction so as to enclose the crucible, and heat shield at the outside of the heaters. The thickness of the portion of the heat shield which faces the lower portion of the crucible is smaller than that of the portion of the heat shield which faces the upper portion of the crucible. The present apparatus further has a radiation shield for shielding the single crystal from the heat radiation, and an upper heat shield which prevents the upward heat transfer from the heaters. In the crucible, the ratio of the height to the diameter is set to 0.85 or more.

According to the invention, the multiple heaters are separately disposed at the upper and lower portions of the periphery of the crucible, and therefore the upper and lower portions of the crucible are uniformly heated by these heaters in the process of melting a raw material in the crucible, thereby relaxing the thermal shock and preventing the crucible from being damaged. Since at least one of the heaters which includes the lowest heater is powered off in the process of pulling the single crystal, this powered-off heater functions as a radiation shield. Since the lower portion of the heat shield is thin, the heat transfer through this lower portion of the crucible is accelerated, whereby a solid layer can be formed stably.

According to the invention, since the radiation shield which is disposed above the crucible so as to cover it except the region for pulling a single crystal, the pulled single crystal is shielded from the heat radiation from the heaters and crucible, so that the deformation of the single crystal and the dislocation accompanied therewith are suppressed. Since the upper heat shield for preventing the upward heat transfer is provided and the ratio of the height to the diameter in the crucible is set 0.85 or more, the temperature difference in the crucible along the vertical direction can be easily set, with the result that it is easy to set the temperature difference for the melted and solid layers along the vertical direction and therefore the solid layer of a large volume can be readily formed.

According to the invention, furthermore, in order to satisfy the above-mentioned equation (10) the power supply for the multiple heaters is controlled and the melting amount of the solid layer is accurately controlled in accordance with the non-segregation condition in the variable-thickness melted layer method.

Moreover, in the invention, the speed and direction of rotating the crucible and pedestal are adjusted so as to control the convection of the molten material, thereby controlling the oxygen concentration of a single crystal.

The above and further objects and features of the invention will more fully be apparent from the following detailed description with accompanying drawings.

DESCRIPTION OF THE PREFERRED EMBODIMENTS

The present invention will be described with reference to the drawings illustrating embodiments.

Figure 1:
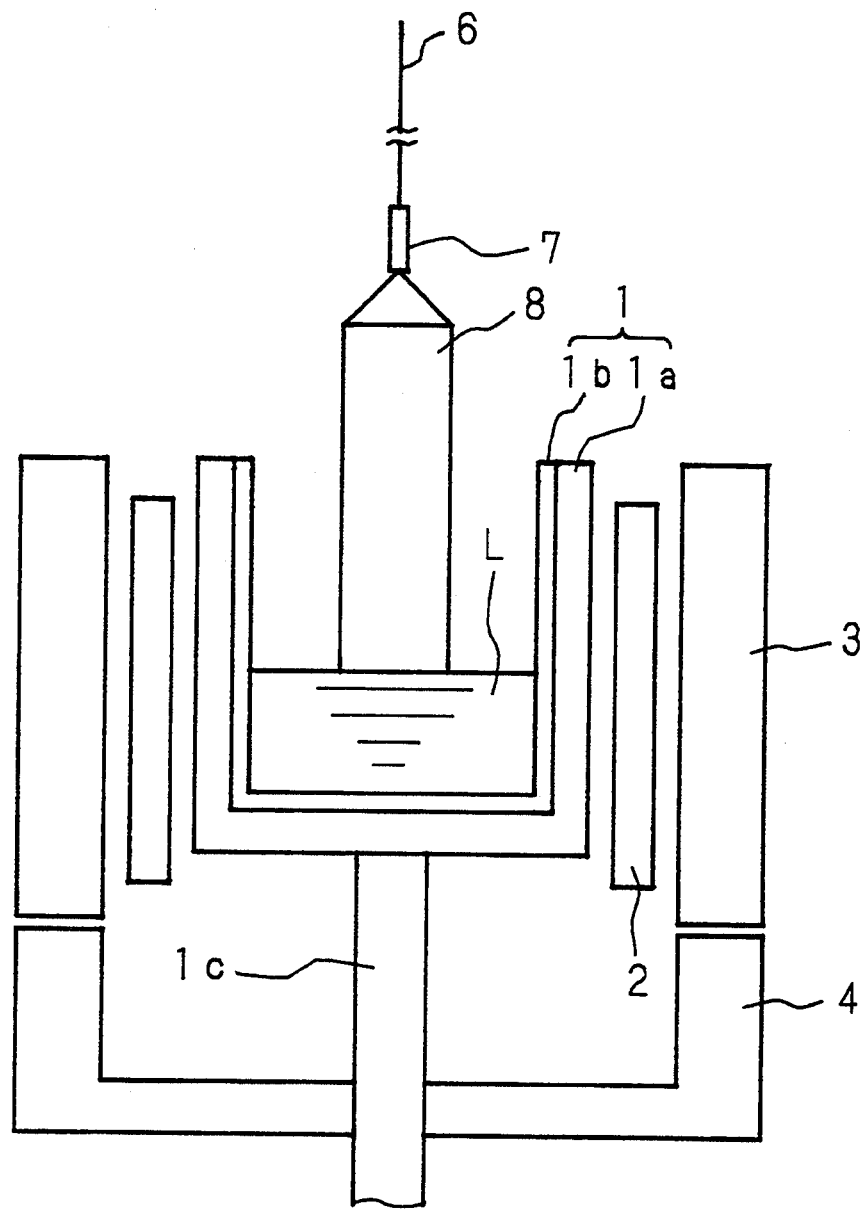
FIG. 1 is a schematic cross-sectional view of an apparatus for growing a single crystal which is used in the conventional CZ method.
Figure 2:
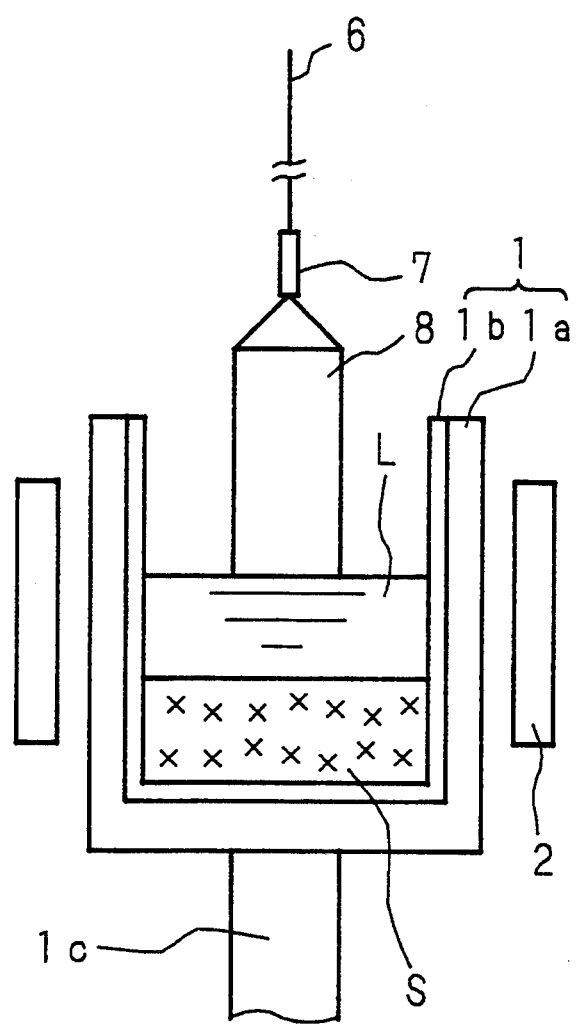
FIG. 2 is a schematic cross-sectional view of an apparatus for growing a single crystal which is used in the melted layer method.
Figure 3A:
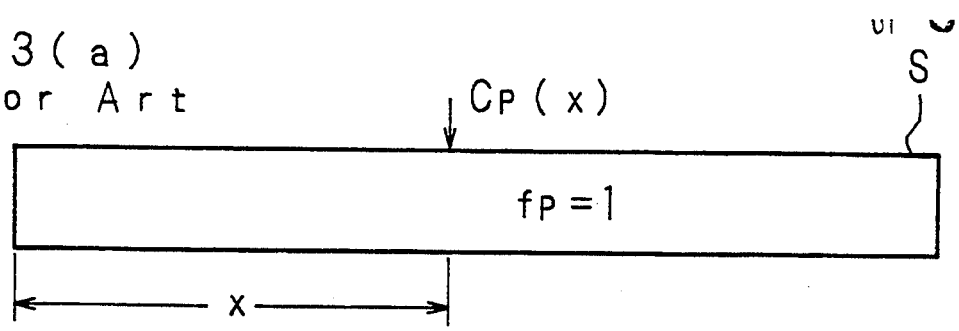
FIG. 3a to 3e are diagrams illustrating the principle of the melted layer method.
Figure 3B:
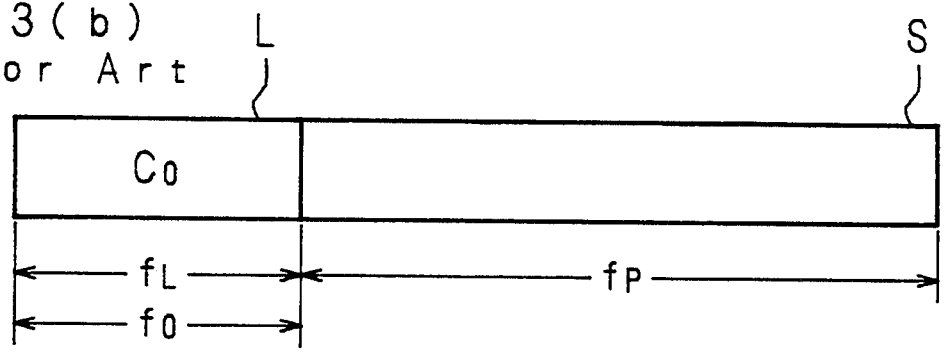
Figure 3C:
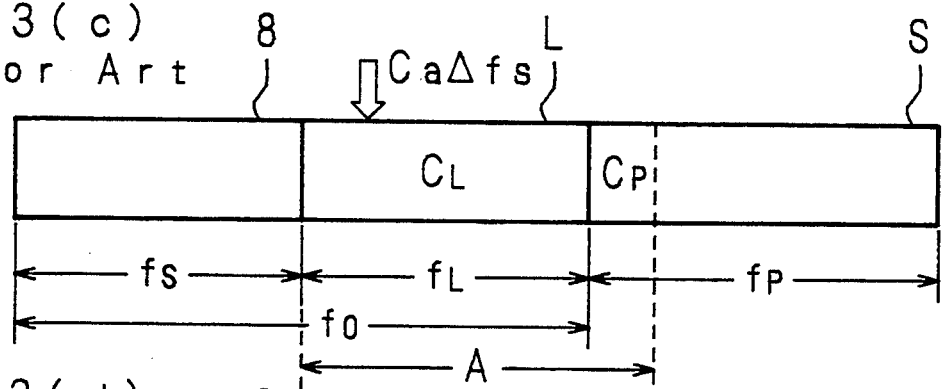
Figure 3D:
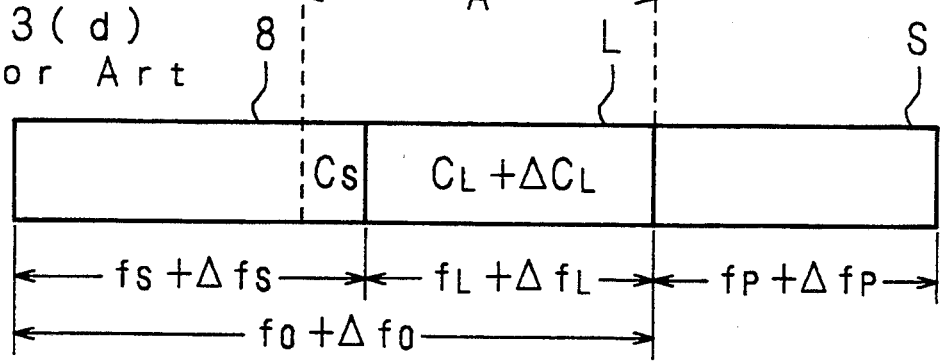
Figure 3E:
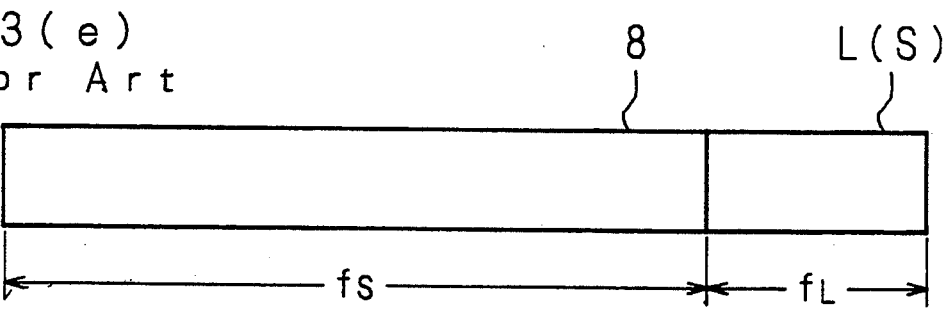
Figure 4:
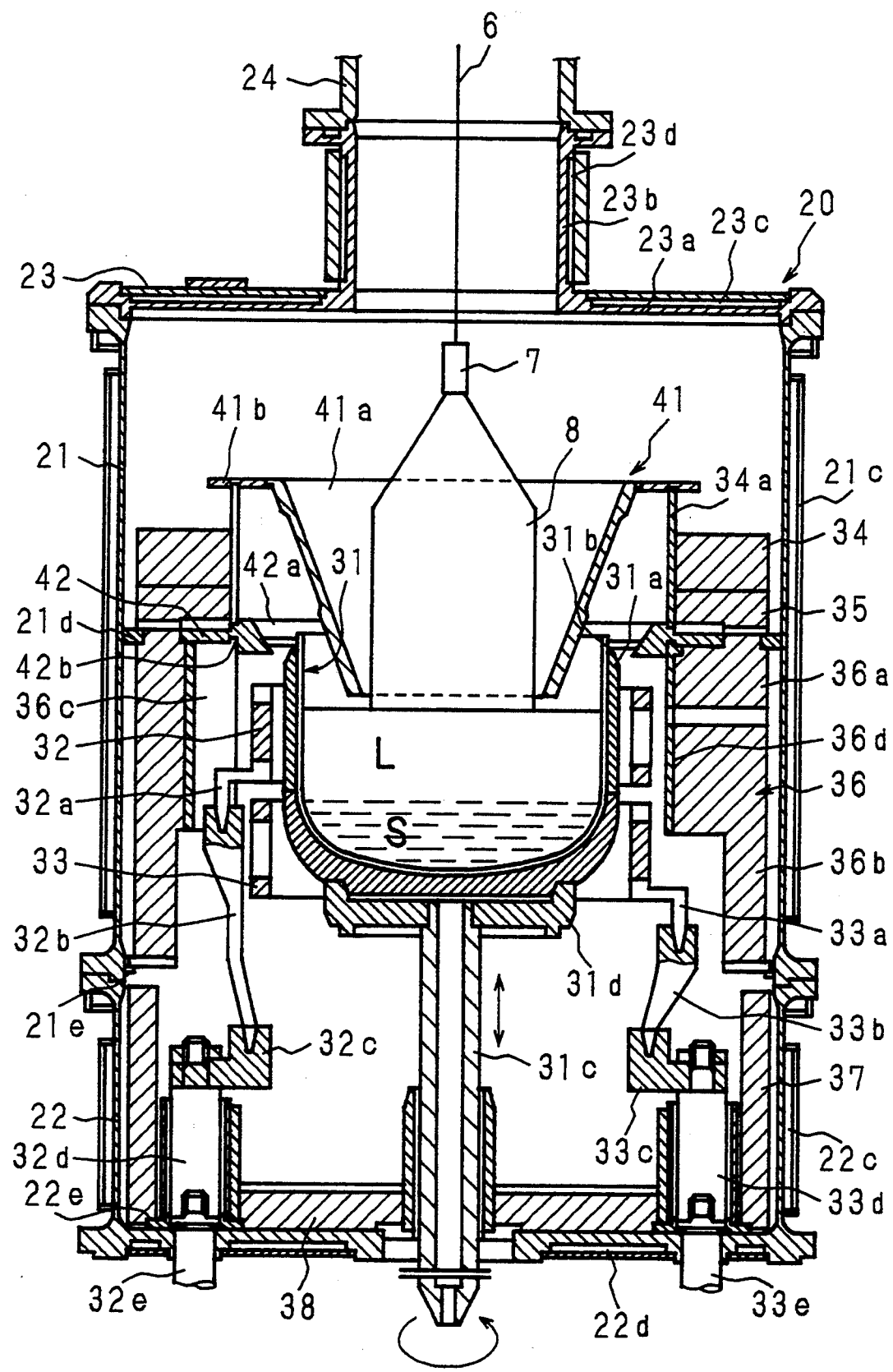
FIG. 4 is a schematic cross-sectional view of an apparatus for growing a single crystal according to the invention.

FIG. 4 is a schematic cross longitudinal section of an apparatus for growing a single crystal according to the invention. In the FIG. 20 and 31 indicate a chamber and a crucible, respectively. The chamber 20 is constructed in the form of a hollow cylinder, and the crucible 31 is placed at the center of the chamber 20. The chamber 20 consists of a cylindrical main chamber 21, a cylindrical subchamber 22 having a bottom and connected to the lower end of the main chamber 21, a top chamber 23 fixed to the upper end of the main chamber 21, and a pull chamber 24. These chambers from 21 to 24 are connected so that the inner space of the chamber 20 is isolated from the outside.

The top chamber 23 has a disk-like cover 23a having a diameter which is substantially equal to that of the main chamber 21, arid a cylindrical portion 23b having a smaller diameter and being placed at the center of the cover 23a. The pull chamber 24 has a diameter substantially equal to that of the cylindrical portion 23b and is detachably connected thereto. A wire 6 which can be raised and lowered and rotated in the same manner as that used in a conventional apparatus is hung from the top of the pull chamber 24. A seed 7 is fixed to the lower end of the pulling shaft 6, and a single crystal 8 grows from the seed 7.

Water cooled jackets 21c, 22c, 22d, 23c and 23d are placed on the outer wall of the main chamber 21, the outer wall and bottom wall of the subchamber 22, and the cover 23a and cylindrical portion 23b of the top chamber 23, respectively. At the upper and lower portions of the periphery of the crucible 31, a main heater 32 and a subheater 33 which are concentrical with the crucible 31 are placed, respectively. At the outside of the heaters 32 and 33 and along the inner wall of the main chamber 21, are placed upper heat shields 34 and 35, and a heat shield 36. Lower heat shields 37 and 38 are placed along the inner wall of the subchamber 22 and on the bottom wall of the subchamber 22, respectively.

The crucible 31 has a double structure in which a quartz crucible 31b is put inside a graphite crucible 31a. The bottom of the crucible 31 is supported via a crucible support 31d by the upper end of a pedestal 31c which elongates through the bottom wall of the subchamber 22. The lower end of the pedestal 31c is coupled to an electric motor (not shown), so that, when the pedestal 31c is rotatively driven by the motor, the crucible 31 is raised or lowered while being rotated.

The main heater 32 and subheater 33 are of the resistance heating type, and have the same shape and size. More specifically, these heaters are each formed into a short cylinder having a diameter slightly greater than the outer diameter of the crucible 31. The heaters 32 and 33 face the zone in which the crucible 31 vertically moves, and are vertically separated by a predetermined distance along the vertical direction. The main heater 32 has a pair of connecting legs 32a, 32b which extend outwardly and downwardly and are connected to a pair of terminal electrodes 32e through a pair of supporting members 32c and a pair of electrodes 32d. Similarly, the subheater 33 has a pair of connecting legs 33a, 33b which are respectively connected to a pair of terminal electrodes 33e through a pair of supporting members 33c and a pair of electrodes 33d. In FIG. 4, only one element of each of these pairs is shown.

The legs 32b and 33b have a groove at their upper end into which the tip of the corresponding one of the connecting legs 32a and 33a is inserted to establish engagement. The terminal electrodes 32e and 33e are connected to a DC power source (not shown) so that the main heater 32 and subheater 33 are simultaneously or selectively powered on.

The upper heat shields 34 and 35, heat shield 36, and lower heat shields 37 and 38 are made of a material having a low thermal conductivity. The upper heat shields 34 and 35 and heat shield 36 are sequentially piled and supported by stays 21d and 21e projecting from the inner wall of the main chamber 21, in such a manner that these shields are separated by a small gap from the inner wall of the main chamber 21 and vertically adjacent shields contact each other. The lower heat shields 37 and 38 are supported by stays 22e provided on the side wall and inner bottom wall of the subchamber 22, and are separated by a small gap from these walls.

A support cylinder 34a which is made of graphite and the axial length of which is greater than that of the upper heat shields 34, 35 is fixed to the inside of the shields 34, 35 in such a manner that the top of the support cylinder 34a is higher than that of the upper heat shield 34. To the support cylinder 34a, is fixed a radiation shield 41 which is made of graphite and which covers the top of the crucible 31 except for the pulling area for the single crystal 8. The radiation shield 41 has a funnel portion 41a and a flange portion 41b which extends outwardly from the top of the funnel portion 41a. The top of the support cylinder 34a placed on the inside of the upper heat shield 34 is fixedly engaged with the flange portion 41b, so that the lower end of the funnel portion 41a is positioned to face the surface of the melted layer L in the crucible 31.

While the outer diameter of the heat shield 36 is constant, the heat shield 36 consists of a thick portion 36a which occupies the middle and upper portions of the shield and has a small inner diameter, and a thin portion 36b which occupies the lower portion of the shield and has a large inner diameter. The thick portion 36a is provided with a longitudinal groove 36c for incorporating the connecting legs 32a of the main heater 32, The reason for forming the lower portion of the heat shield 36 facing the lower portion of the crucible 31 is to promote the heat radiation from the lower portion of the crucible 31.

A graphite cylinder 36d is fixed to the inner face of the heat shield 36. An eaves-like shielding member 42 is sandwiched by the upper end face of the heat shield 36 and the lower end face of the upper heat shield 35 so as to cover the top of the main heater 32 and subheater 33. In the shielding member 42, the inner edge is thick, and the portion facing the radiation shield 41 is formed into a taper face 42a. A groove 42b into which the top edge of the cylinder 36d engages is formed on the lower face of the shielding member 42. The shielding member 42 is positioned with respect to the heat shield 36 by engaging the top edge of the cylinder 36d into the groove 42b.

Ar gas is supplied through the pull chamber. The supply system is not shown in FIG. 4. Exhaust processing is executed from a base chamber by means of a vacuum pump (not shown).

Figure 5:
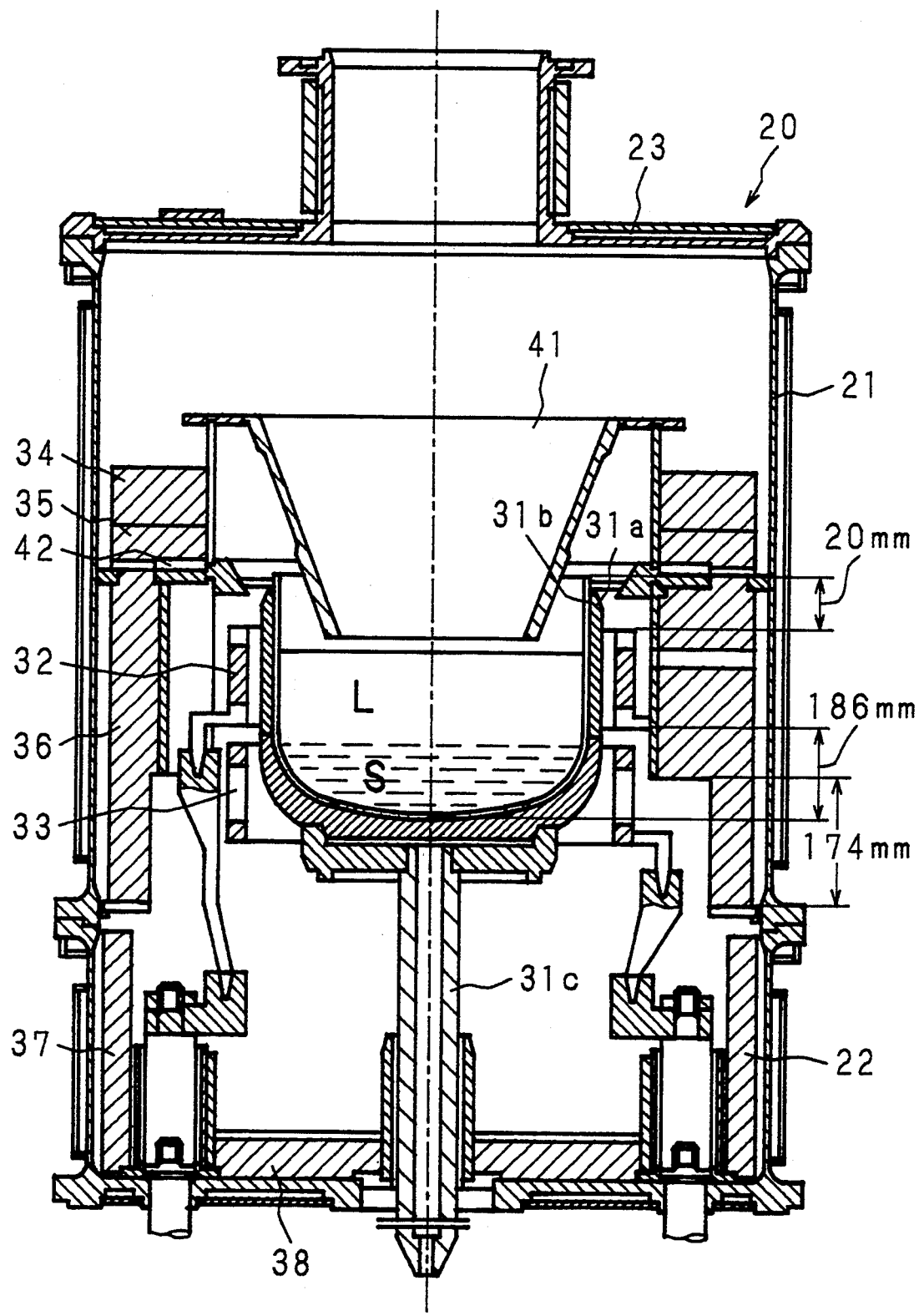
FIG. 5 shows dimensions of the apparatus shown in FIG. 4.

FIG. 5 shows dimensions of the apparatus of FIG. 4. The inner diameter and height of the quartz inner crucible 31b are set to 16 inches and 14 inches, respectively, and hence the ratio of the height to the inner diameter is 0.875. This enables the temperature difference along the vertical direction to be easily set and the solid layer S to be stably formed.

The ratio of the height to the inner diameter is not limited to 0.875, but may be any value more than 0.85. If the ratio of the height to the inner diameter of the inner crucible 31b is less than 0.85, it is very difficult to form the predetermined solid layer S in the early stage of the pulling process.

The height (the dimension in the axial direction) of the main heater 32 is 150 mm, and in the pulling process the top of the main heater 32 is lower than that of the crucible 31 by at least 20 mm or more. If the top of the main heater 32 is positioned to be higher than that of the crucible 31, it is easy to form the solid layer S, but the single crystal 8 is directly heated and indirectly heated by an elevated temperature of the inner wall of the crucible 81, whereby the pulling speed is remarkably reduced.

In the early stage of pulling a single crystal, the lower end of the main heater 32 is higher than the bottom of the inner crucible 31b, the lower end of the subheater 33 (not used in the pulling process) is lower than the lower end of the inner crucible 31b, and the upper end of the subheater 33 is higher than the lower end of the inner crucible 31b. This prevents the lower portion of the inner crucible 31b from being heated, thereby facilitating the formation of the solid layer S.

The top of the thin portion 36b of the heat shield 36 is arranged to be in the range of the position of the lower end of the inner crucible 31b+0.3 X (the height of the inner crucible 31b). The inner diameter of the thin portion 36b of the heat shield 36 is greater than that of the thick portion 36a by about 120 mm, and the axial length of the thin portion 36b is 174 mm. This configuration promotes the heat transfer from the lower portion of the inner crucible 31b, thereby facilitating the formation of the solid layer S.

A procedure of growing a single crystal using the thus configured apparatus and method of growing a single crystal will be described with giving specific values.

At first, about 65 kg of silicon polycrystal (35 kg in lump and 30 kg in chip) is charged into the crucible 31 as a raw material for a crystal. After the interior of the chamber 20 is set to an Ar atmosphere of about 10 Torr, each of the main heater 32 and subheater 33 is activated by a power of 50 kW (100 kW in total) so that all of the raw material is melted.

Then, the output of the main heater 32 is increased to 70 kW and that of the subheater 33 is reduced to 0 kW, whereby the solid layer S is started to grow in the lower portion of the crucible 31. When the solid layer S stops growing and becomes stable, phosphorus (segregation coefficient: 0.35) is added as an N-type dopant. Thereafter, while keeping the subheater 33 unactivated, the lower end of the seed 7 is immersed in the melted layer L. The single crystal 8 is pulled up while rotating the crucible 31 and wire 6 at a predetermined rotation speed. In this case, the crucible 31 and wire 6 are rotated in the same direction, and at 1 rpm and 15 rpm, respectively. Since the surface level of the melted layer L is lowered as the single crystal 8 is pulled up, the crucible 31 is lifted so that the surface of the melted layer L is kept at a fixed level. As the crucible 31 moves upwardly, the positional relationship between the heaters 32 and 38 and the crucible 31 changes, and hence the solid layer S melts. During this process, the subheater 33 functions as a radiation shield.

In this process of pulling the single crystal 8, the upward heat transfer from the main heater 32 is prevented by the shielding member 42, and the heat from the heaters 32 and 33, the crucible 31 and the melted layer L is prevented by the radiation shield 41 from being directly irradiated to the single crystal 8 except that passing through the small gap formed between the single crystal 8 and the radiation shield 41.

In this way, according to the present invention, when the whole of a raw material is melted, the lower portion of the crucible 31 and the raw material charged in the lower portion are heated by the subheater 33 in a similar manner as the upper portion of the crucible 31 and the raw material charged in the upper portion. Therefore, the molten material flowing from the upper portion of the crucible 31 is prevented from solidifying in the lower portion of the crucible 31. Since the temperature of the lower portion of the crucible 31 is high, furthermore, the thermal shock is weakened, whereby the crucible 31 is prevented from being broken during the process of melting the raw material.

After the whole of the raw material charged into the crucible 31 has been melted, the power supply to the subheater 33 is stopped, and therefore the subheater 33 functions as a radiation shield which shields the lower portion of the crucible 31 from the heat irradiated toward this portion from the main heater 32. This serves to form the solid layer S in the lower portion easily.

According to the present invention, the whole of a raw material charged in the crucible 31 is melted using the main heater 32 and the subheater 33, and the molten material is gradually solidified along the direction from the bottom of the crucible 31 toward the upper portion thereof to form the solid layer S of polycrystal, and thereafter the growth of a single crystal is started from the melted layer L in the crucible 31, with the condition that a large number of air gaps existing in the raw material charged in the crucible 31 are eliminated. And, the oxides on the surface of raw material are removed when the whole of raw material is melted, and the non-dislocation pulling ratio is increased. It is desirable to remove the oxides because the oxides prevent the crystal from growing without dislocation. Since the melting amount of the solid layer S in the process of pulling a single crystal can be controlled using the heater 32, 33 so as to satisfy the aforementioned equation (10), the melting amount of the solid layer S in the process of pulling the single crystal 8 can be accurately controlled in accordance with the non-segregation condition of the variable-thickness melted layer method.

In order to confirm the effect of multiple heaters, experiments were conducted as described below. In these experiments, a silicon single crystal was pulled in accordance with the variable-thickness melted layer method having the steps described above. The conditions in this pulling process are listed in Table 1 below. As a comparison, comparison experiments were conducted under the same conditions except that the subheater was not provided and the heating was performed by a single heater.

TABLE 1

| | |
|---|---|
| Pulled crystal | 6-Inch N-type silicon single |
| Silicon Raw material | 65 kg |
| Main heater 32 | 460 mm (I.D.) × 508 mm (O.D.) × 150 mm (H) |
| Subheater 33 | 460 mm (I.D.) × 508 mm (O.D.) × 150 mm (H) |
| Distance between heaters 32 and 33 | 20 mm |
| Chamber 20 | 845 mm (D) × 600 mm (H) |

Under the above conditions, the raw material was melted. The comparison experiments were carried out ten times. The crucible 31 was broken in two of these ten comparison experiments when a raw material was melted. In these experiments, the power of the single heater was 110 kW, and it took 10 hours to melt the whole of the raw material, and in all of these experiments the floating of the lumpy solid material having a diameter of 100 mm or more was observed in the latter half period of the melting process. Fifteen experiments implementing the invention were carried out in which the powers of the main heater 32 and subheater 33 were 47 kw and 55 kw, respectively. In these experiments, there was no break of the crucible 31, and the floating of the lumpy solid material having a diameter of 100 mm or more was not observed in the latter half period of the melting process. Only a few times the floating of the lump with a small diameter was observed, but it was not a problem. It took 8 hours to melt the whole of the crystal material. The single crystals obtained in the experiments implementing the invention were almost in the non-segregation state as compared with the single crystals obtained in the comparison experiments.

Experiments were carried out to confirm the effect of the radiation with the results described below. The crucible 31 consisted of the quartz crucible 31b (inner diameter: 390 mm, depth: 350 mm, and thickness: 8 mm), the graphite crucible 31a, and the pedestal 31c. The radiation shield 41 was made of graphite, and the funnel portion 41a had a form of an inverse truncated cone (inner diameter at the lower end: 200 mm, inner diameter at the upper end: 420 mm, and height: 200 mm). A single crystal was pulled according to the variable-thickness melted layer method in which 65 kg of polysilicon was charged as a raw material and the seed 7 was (100) silicon. About 40% of the single crystals obtained by a comparison experiment in which the radiation shield 41 was not provided had dislocation. By contrast, in experiments under the invention in which the radiation shield 41 was provided, the deformation of a single crystal during the process of forming the shoulder portion was largely reduced, and it was confirmed that the dislocation which is considered to be caused by that deformation was almost eliminated.

Owing to the adiabatic effect of the upper heat shields 34, 35, the output of the main heater 32 can be remarkably reduced and the temperature of the heater can be lowered. As a result, the temperature of the inner crucible 31b drops so as to lower the temperature of the inner space of the crucible 31, whereby the temperature of the melted layer L falls and the solid layer S becomes larger. This enlargement of the solid layer S causes the solid layer S to melt in a larger amount, during crystal growth, so that the segregation of the impurity is prevented from occurring, thereby improving the yield.

In order to confirm the effect of the upper heat shields 34, 35 experiments were conducted as described below. A comparison experiment was carried out in which a single crystal was grown using an apparatus having the same structure as that shown in FIG. 4 except that the upper heat shields 34, 35 were not provided. Table 2 shows the growing conditions and results.

TABLE 2

| | Invention | Comparison |
|---|---|---|
| Upper heat shields 34, 35 | Provided | Not provided |
| Thickness of solid layer S (mm) | 100 | 80 |
| Thickness of melted layer L (mm) | 140 | 160 |
| Power of heater 32 (kW) | 73 | 85 |
| Yield (%) | 66 | 55 |

As seen from Table 2 above, the provision of the upper heat shields 34, 35 for preventing the heat loss caused the height of the solid layer S to be increased by 20 mm, the power of the main heater 32 to be reduced by 14%, and the product yield to be improved by 11%.

In the invention, the ratio of the height to the diameter of the inner crucible 31 is 0.85 or more, and therefore it is possible to easily produce the temperature difference along the vertical direction and stably form the solid layer S. Since the lower portion of the heat shield 36 is partly removed to form the thin portion 36b, the heat transfer from the lower portion of the inner crucible 31b is promoted, thereby facilitating the formation of the solid layer S. The process of growing a single crystal was conducted using an apparatus in which the lower portion of the heat shield 36 was not partly removed (i.e., an apparatus having a heat shield the inner diameter of which was uniform along the entire vertical length). In this case, it was confirmed that the thickness of the solid layer S was about 40 mm even in the initial stage of the pulling process, and that an effective execution of the melted layer method could not be easily done.

Next, the control of the rotation speed and rotation direction of the crucible 31 and wire 6 which is conducted in order to increase the oxygen concentration of the pulled single crystal 8 will be described.

Figure 6:
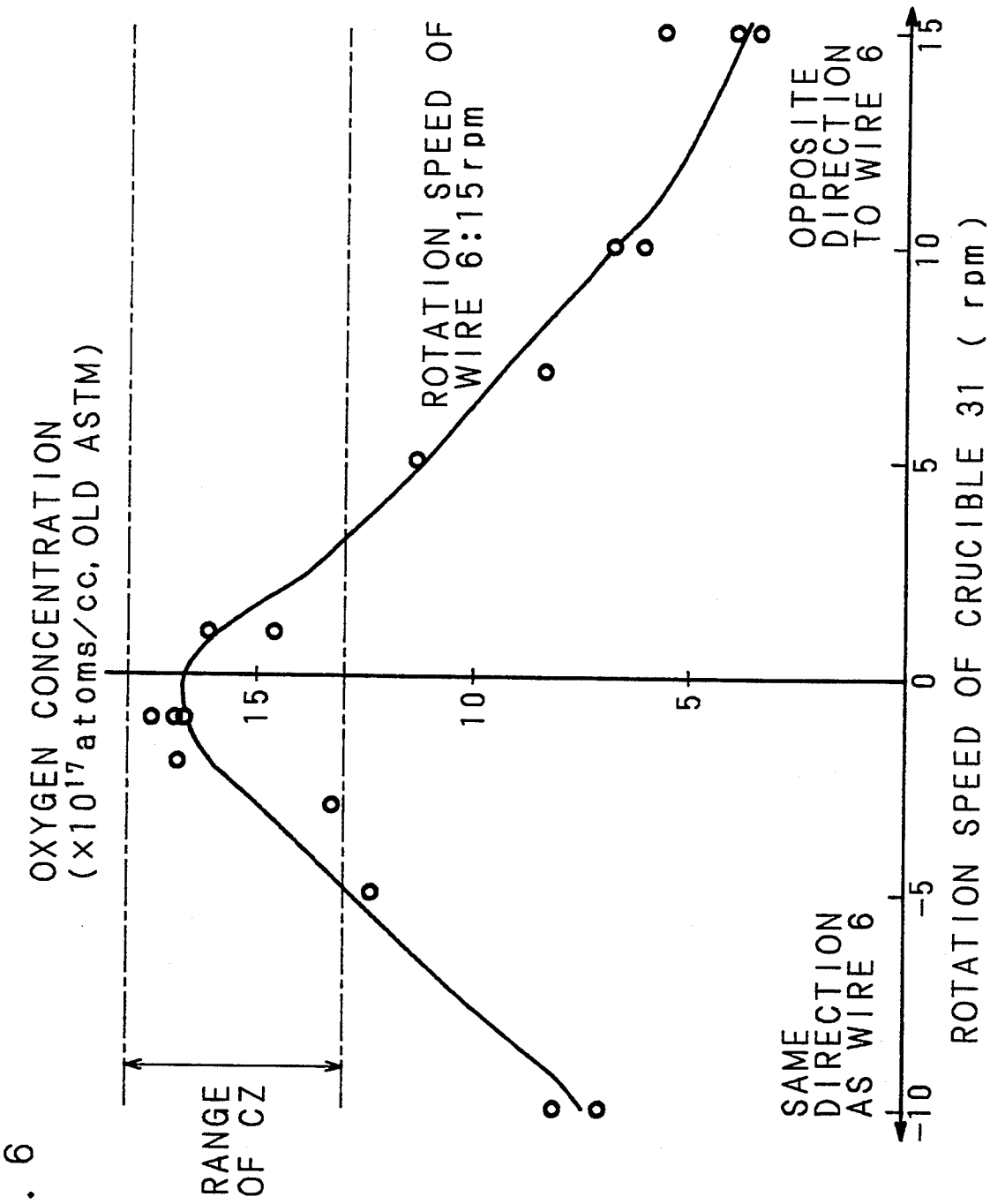
FIG. 6 is a graph illustrating the relationship between the rotation speed of a crucible and the oxygen concentration of a single crystal.

FIG. 6 is a graph illustrating the relationship between the rotation speed of the crucible 31 and the oxygen concentration of the single crystal 8. The illustrated relationship is obtained in the case that the wire 6 is rotated at 15 rpm. The range of the oxygen concentration defined by two dashed lines is the range of the oxygen concentration of a single crystal pulled by the usual CZ method (13–18×10$^{17}$ atoms/ccm, oed ASTM). As seen from FIG. 6, the oxygen concentration of a single crystal largely varies depending upon the rotation speed of the crucible 31. When the crucible 31 and wire 6 rotate in the same direction and the rotation speed of the crucible 31 is about 1 rpm, the highest oxygen concentration can be attained. In any of the other combinations of the speed and direction of the rotation, the oxygen concentration is low. It is confirmed that the oxygen concentration of the usual CZ method is obtained by rotating tile crucible 31 at the vicinity of 1 rpm.

Figure 7:
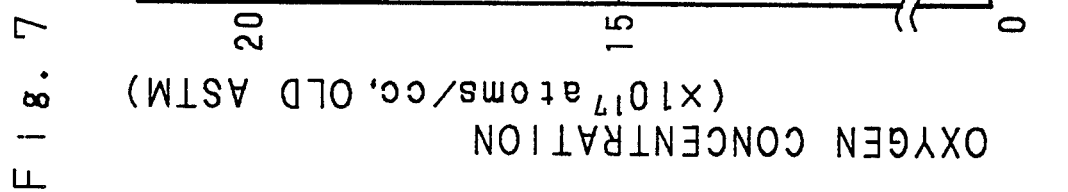
FIG. 7 is a graph illustrating the relationship between the rotation speed of a wire and the oxygen concentration of a single crystal.

FIG. 7 is a graph illustrating the relationship between the rotation speed of the wire 6 and the oxygen concentration of the single crystal 8. The illustrated relationship is obtained in the case that the crucible 31 is rotated at 1 rpm in the same direction as the wire 6. As seen from FIG. 7, the variation of the oxygen concentration of a single crystal caused by the variation of the rotation speed of the wire 6 is not so remarkable as the above-mentioned variation caused by varying the rotation speed of the crucible 31, but the oxygen concentration decreases slightly with the increase of the rotation speed of the wire 6.

As seen from these results, the oxygen concentration of the pulled single crystal 8 can be controlled by adjusting the rotation speed and direction of the crucible 31. More specifically, it is preferable that the crucible 31 and pulling shaft 6 are rotated in the same direction, and that the rotation speeds of the crucible 31 and the wire 6 are set to 1(rpm) and 15(rpm), respectively.

Figure 8:
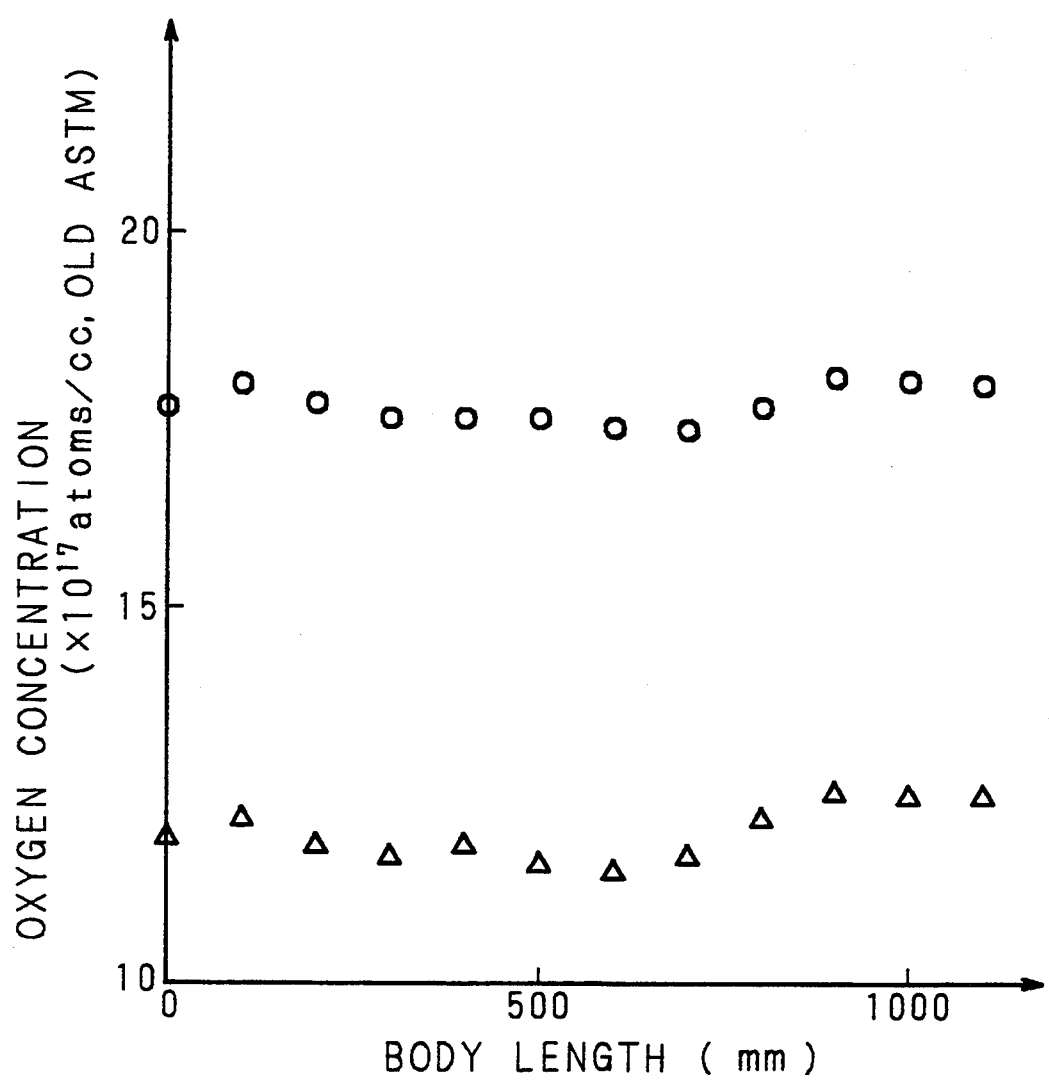
FIG. 8 is a graph illustrating the relationship between the body length and oxygen concentration of a single crystal.

FIG. 8 is a graph illustrating the relationship between the body length and oxygen concentration of the single crystal 8 which was pulled under the condition of the above-mentioned rotation speed and direction of the crucible 31 and wire 6. Comparison experiments were carried out in which the crucible 31 was rotated at 5 rpm in the direction opposite to that of the wire 6. In FIG. 8, "○" indicates the results obtained in the experiments according to the invention, and "Δ" those obtained in the comparison experiments. As seen from FIG. 8, in the comparison experiments, the oxygen concentration for any of the body lengths of the single crystal 8 was very low (11–12×10$^{17}$ atoms/cc), but in the experiments according to the invention a high oxygen concentration of 17–18×10$^{17}$ atoms/cc which is in the same level as that of a single crystal produced by the usual CZ method was obtained for any of the body lengths of the single crystal 8.

In the above-described embodiment, the output of the subheater 33 is set to zero in the pulling process. Alternatively, in order to increase the melting rate, the subheater 33 may be powered on in the process of pulling the single crystal 8. This embodiment will be described. In this embodiment, of course, it is necessary to change the outputs of the main heater 32 and subheater 33 with the passage of time so as to satisfy the non-segregation condition in the variable-thickness melted layer method which is indicated by the aforementioned equation (10).

The processes of charging a raw material (silicon polycrystal) into the crucible 31, melting the raw material, forming the solid layers S and adding a dopant (phosphorus) are the same as those in the above-described embodiments, and therefore their description is omitted. After these processes, the lower end of the seed 7 is immersed into the melted layer L, and the single crystal 8 is pulled up while rotating the crucible 31 and wire 6 by the rotation speeds of 1(rpm) and 15(rpm), respectively. After the neck and shoulder portions of the single crystal 8 are formed and when the process of pulling the single crystal 8 advances to the formation of the body portion, the powers of the main heater 32 and subheater 33 are changed so as to satisfy the non-segregation condition in the variable- thickness melted layer method which is indicated by the aforementioned equation (10). In this embodiment, namely, the outputs of the two heaters 32 and 33 are changed so that the pulling rate of 1 mm/min and the pulled-crystal diameter of 154 mm are maintained.

Figure 9:
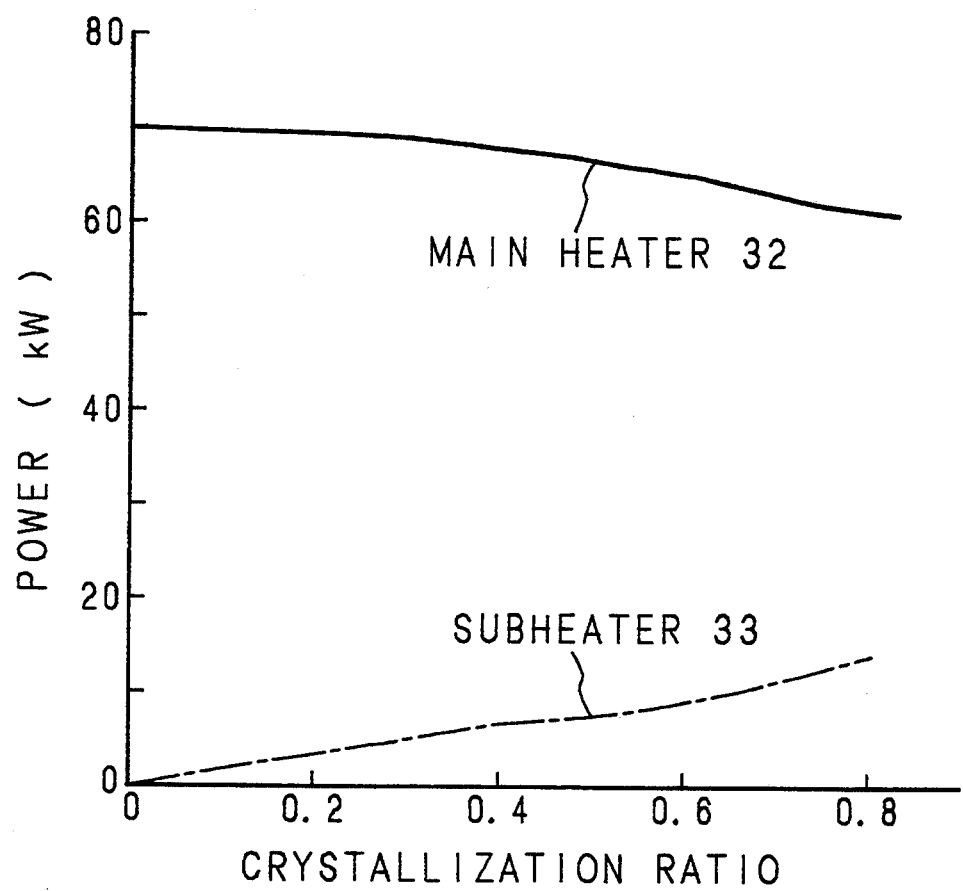
FIG. 9 is a graph illustrating the relationship between the crystallization ratio and the powers of heaters used in the process of pulling a single crystal.

FIG. 9 shows the heating patterns of the heaters 32 and 33 in the process of pulling the single crystal 8. The solid line and dashed line of FIG. 9 indicate the heating pattern of the main heater 32 and that of the subheater 33, respectively. In the figure, the ordinate indicates the output of each of tile heaters 32 and 33, and the abscissa the crystallization ratio. The heating patterns shown in FIG. 9 are adjusted so as to satisfy the aforementioned equation (10) experimentally and analytically.

Figure 10:
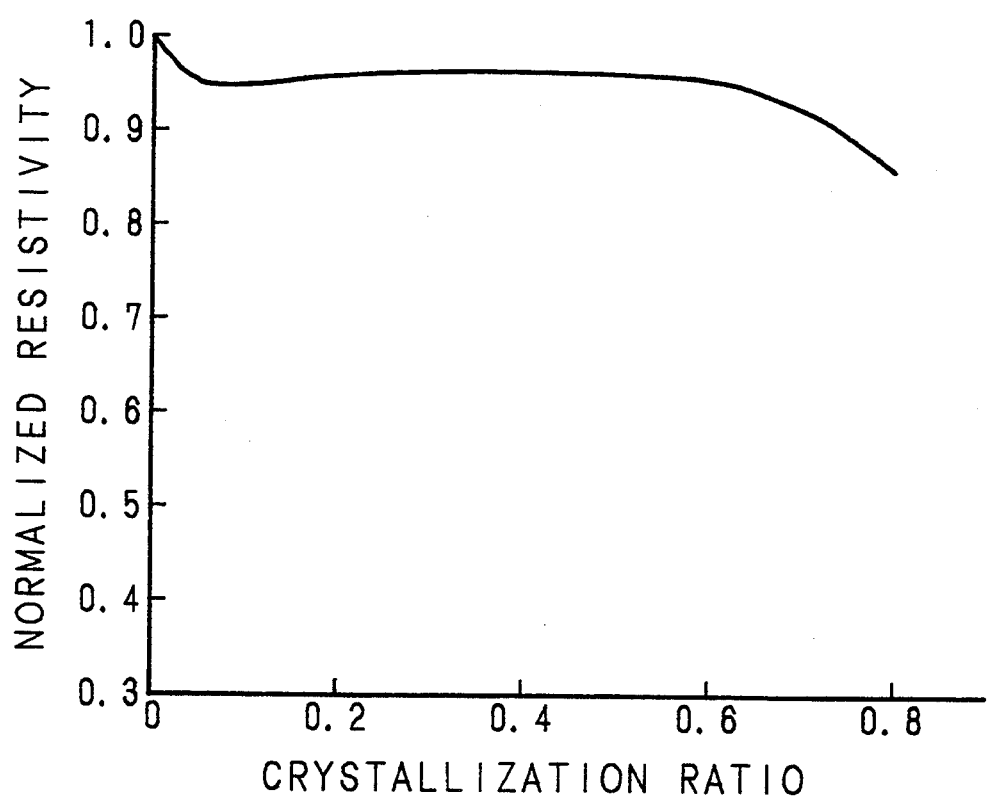
FIG. 10 is a graph illustrating the relationship between the crystallization ratio and resistivity of a pulled single crystal.

FIG. 10 illustrates the distribution of the resistivity in the axial direction with respect to the crystallization ratio obtained when the solid layer S is melted according to the heating pattern shown in FIG. 9 in the process of pulling the single crystal 8. Since the heating patterns of the two heaters 32 and 33 are set in due consideration of the equation (10), the impurity concentration of the melted layer L is constant, and, when the crystallization ratio $f_S$ is 0.65, the resistivity in the axial direction of the pulled single crystal 8 is 0.94 or more as the ratio to the initial state.

In the above-described embodiments wherein the variable-thickness melted layer method is used, the impurity dopant is added after the formation of the solid layer S. Alternatively, the process may be conducted in the following sequence: at first the whole of a raw material is melted; an impurity dopant is added in the liquid; and then the solid layer S is formed. This embodiment can achieve the similar effect as the above-described embodiments.

Although the invention has been described by illustrating the embodiments in which a silicon single crystal is grown, it is obvious that the invention can be applied to the growth of various single crystals useful as a semiconductor material.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible; and heat shielding means, in which the lower portion is thinner than the upper portion, placed at the outside of the heating means, the lower portion of the heat shielding means having a larger inner diameter than the upper portion thereof.

2. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

radiation shielding means, placed between the crucible and a growing single crystal, for shielding the single crystal from the radiation heat out of the crucible and the molten material in the crucible; and heat shielding means, in which the lower portion is thinner than the upper portion, placed at the outside of the heating means, the lower portion of the heat shielding means having a larger inner diameter than the upper portion thereof.

3. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

first heat shielding means, in which the lower portion has a larger inner diameter and is thinner than the upper portion, placed at the outside of the heating means; and second heat shielding means, placed above the heating means, for preventing the upward heat transfer of the heating means.

4. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

radiation shielding means, placed between the crucible and a growing single crystal, for shielding the single crystal from the radiation heat out of the crucible and the molten material in the crucible;

first heat shielding means, in which the lower portion has a larger inner diameter and is thinner than the upper portion, placed at the outside of the heating means; and second heat shielding means, placed above the heating means, for preventing the upward heat transfer of the heating means.

5. An apparatus for growing a single crystal according claim 4, wherein the crucible is in the form of a cylinder having a bottom, the ratio of the height to the diameter of the crucible being 0.85 or more.

6. An apparatus for growing a single crystal by pulling up molten material while solid material in the lower part of a crucible is being melted from the upper portion of the solid material toward the lower portion, comprising:
   a crucible;
   heating means, arranged at the outside of the crucible and along the vertical direction, for heating the crucible; and
   heating shielding means, in which the lower portion is thinner than the upper portion, placed at the outside of the heating means, the lower portion having an inner diameter which is larger than an inner diameter of the upper portion.

7. An apparatus for growing a single crystal by pulling up molten material while solid material in the lower part of a crucible is being melted from the upper portion of the solid material toward the lower portion, comprising:
   a crucible;
   heating means, arranged at the outside of the crucible and along the vertical direction, for heating the crucible;
   radiation shielding means, placed between the crucible and a growing single crystal, for shielding the single crystal from the radiation heat out of the crucible and the molten material in the crucible; and
   heat shielding means, in which the lower portion is thinner than the upper portion, placed at the outside of the heating means, the lower portion having an inner diameter which is larger than an inner diameter of the upper portion.

8. An apparatus for growing a single crystal by pulling up molten material while solid material in the lower part of a crucible is being melted from the upper portion of the solid material toward the lower portion, comprising:
   a crucible;
   heating means, arranged at the outside of the crucible and along the vertical direction, for heating the crucible;
   first heat shielding means, in which the lower portion is thinner than the upper portion, placed at the outside of the heating means, the lower portion having an inner diameter which is larger than an inner diameter of the upper portion; and
   second heat shielding means, placed above the heating means, for preventing the upward heat transfer of the heating means.

9. An apparatus for growing a single crystal by pulling up molten material while solid material in the lower part of a crucible is being melted from the upper portion of the solid material toward the lower portion, comprising:
   a crucible;
   heating means, arranged at the outside of the crucible and along the vertical direction, for heating the crucible;
   radiation shielding means, placed between the crucible and a growing single crystal, for shielding the single crystal from the radiation heat out of the crucible and the molten material in the crucible;
   first heat shielding means, in which the lower portion is thinner than the upper portion, placed at the outside of the heating means, the lower portion having an inner diameter which is larger than an inner diameter of the upper portion; and
   second heat shielding means, placed above the heating means, for preventing the upward heat transfer of the heating means.

10. A method of growing a single crystal by pulling up molten material while solid material in the lower part of a crucible is being melted from the upper portion of the solid material toward the lower portion, comprising the steps of:
    charging the solid raw material into the crucible;
    melting the whole of the charged raw material by multiple heating means arranged at the outside of the crucible and along the vertical direction;
    solidifying the molten material positioned in the lower portion of the crucible to form a solid layer while maintaining a layer of the molten material during the solidifying step, by deactivating at least one of the multiple heating means including the lowest one of the heating means; and
    growing the single crystal from the molten material in the crucible while melting the formed solid layer by controlling the heating means in a manner such that $f_L = f_{LO} - Ke\, f_S$, wherein $f_L$ is the weight ratio of the molten liquid, $f_{LO}$ is the initial weight ratio of the melted layer prior to crystal pulling, Ke is the effective segregation coefficient and $f_S$ is the weight ratio of the pulled crystal.

11. A method of growing a single crystal according to claim 10, wherein the multiple heating means are two heaters which are arranged at the outside of the crucible and along the vertical direction, and the single crystal is grown while melting the solid layer by activating only the upper heater while the output of the lower heater is set to zero.

12. A method of growing a single crystal according to claim 11, wherein, when the solid layer is melted by activating the upper heater, the lower heater shields the lower portion of the crucible from the radiation heat out of the upper heater.

13. A method of growing a single crystal according to claim 10, wherein the multiple heating means are two heaters which are arranged at the outside of the crucible and along the vertical direction, and the melting amount of the solid layer is controlled by adjusting heating patterns of the two heaters.

14. A method of growing a single crystal, in which a crucible and a crystal can be rotatable independently, solid material formed in the lower part of the crucible is melted from the upper portion of the solid material toward the lower portion during the growth, and the crucible and crystal are rotated during the growth, comprising the steps of:
    charging the solid raw material into the crucible;
    melting the whole of the charged raw material by multiple heating means arranged at the out, side of the crucible and along the vertical direction;
    solidifying the molten material positioned in the lower portion of the crucible to form a solid layer, by deactivating at least one of the multiple heating means including the lowest one of the heating means; and
    growing the single crystal from the molten material in the crucible while melting the formed solid layer and controlling the rotation speed and rotation direction of the crucible and the crystal.

15. A method of growing a single crystal by pulling up molten material while solid material in the lower part of a crucible is being melted from the upper portion of the solid material toward the lower portion, comprising:

a first step of charging the solid raw material into the crucible;

a second step of melting the whole of the charged raw material by multiple heating means arranged at the outside of the crucible and along the vertical direction;

a third step of solidifying the molten material positioned in the lower part of the crucible to form a solid layer, by deactivating at least one of the multiple heating means including the lowest one of the heating means; and a fourth step of growing the single crystal from the molten material in the crucible while melting the formed solid layer, wherein the ratio of the height to the diameter of the crucible is 0.85 or more, the crucible is kept warm by first heat shielding means placed at the outside of the heating means in the second, third and fourth steps, the radiation heat from the crucible and the molten material in the crucible to the growing single crystal is shielded by radiation shielding means placed between the crucible and the growing single crystal in the fourth step, and the upward heat transfer of the heating means is prevented by second heat shielding means placed above the heating means in the second, third and fourth steps.

16. A method of growing a single crystal according to claim 15, wherein the lower portion of the first heat shielding means is thinner than the upper portion, and the amount of radiation heat loss from the lower portion of the crucible is extremely larger than that from the upper potion in the third step.

17. An apparatus for growing a single crystal by pulling up molten material While solid material in the lower part of a crucible is being melted from the upper portion of the solid material toward the lower portion, comprising:

a crucible;

multiple heating means, arranged at the outside of the crucible and along the vertical direction, for heating the crucible; and heat shielding means placed at the outside of the heating means;

the multiple heating means comprising a main heater and a sub-heater, the main heater and sub-heater being electrically connected to different power supplies.

18. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible; and heat shielding means, in which the lower portion is thinner than the upper portion, placed at the outside of the heating means;

the multiple heating means comprising a main heater and a sub-heater, the main heater and sub-heater being electrically connected to different power supplies.

19. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

radiation shielding means, placed between the crucible and a growing single crystal, for shielding the single crystal from the radiation heat out of the crucible and the molten material in the crucible; and heat shielding means placed at the outside of the heating means;

the multiple heating means comprising a main heater and a sub-heater, the main heater and sub-heater being electrically connected to different power supplies.

20. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

first heat shielding means placed at the outside of the heating means; and second heat shielding means, placed above the heating means, for preventing the upward heat transfer of the heating means;

the multiple heating means comprising a main heater and a sub-heater, the main heater and sub-heater being electrically connected to different power supplies.

21. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

radiation shielding means placed between the crucible and a growing single crystal, for shielding the single crystal from the radiation heat out of the crucible and the molten material in the crucible; and heat shielding means, in which the lower portion is thinner than the upper portion, placed at the outside of the heating means;

the multiple heating means comprising a main heater and a sub-heater, the main heater and sub-heater being electrically connected to different power supplies.

22. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

first heat shielding means, in which the lower portion is thinner than the upper portion, placed at the outside of the heating means; and second heat shielding means, placed above the heating means, for preventing the upward heat transfer of the heating means;

the multiple heating means comprising a main heater and a sub-heater, the main heater and sub-heater being electrically connected to different power supplies.

23. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

radiation shielding means, placed between the crucible and a growing single crystal, for shielding the single crystal from the radiation heat out of the crucible and the molten material in the crucible;

first heat shielding means placed at the outside of the heating means; and second heat shielding means, placed above the heating means, for preventing the upward heat transfer of the heating means;

the multiple heating means comprising a main heater and a sub-heater, the main heater and sub-heater being electrically connected to different power supplies.

24. An apparatus for growing a single crystal by pulling up molten material while solid material in the lower part of a crucible is being melted from the upper portion of the solid material toward the lower portion, comprising:

a crucible;

multiple heating means, arranged at the outside of the crucible and along the vertical direction, for heating the crucible;

radiation shielding means, plated between the crucible and a growing single crystal, for shielding the single crystal from the radiation heat out of the crucible and the molten material in the crucible;

first heat shielding means, in which the lower portion is thinner than the upper portion, placed at the outside of the heating means; and second heat shielding means, placed above the heating means, for preventing the upward heat transfer of the heating means;

the multiple heating means comprising a main heater and a sub-heater, the main heater and sub-heater being electrically connected to different power supplies.

* * * * *